United States Patent [19]

Munakata et al.

[11] Patent Number: 4,948,979

[45] Date of Patent: Aug. 14, 1990

[54] VACUUM DEVICE FOR HANDLING WORKPIECES

[75] Inventors: Yasuo Munakata; Mineo Gotou, both of Kawasaki, Japan

[73] Assignee: Kabushiki Kaisha Toshiba, Kawasaki, Japan

[21] Appl. No.: 287,166

[22] Filed: Dec. 21, 1988

[30] Foreign Application Priority Data

Dec. 21, 1987 [JP] Japan .............................. 62-323334

[51] Int. Cl.$^5$ ............................................ H01V 37/18
[52] U.S. Cl. .............................. 250/492.2; 250/441.1; 414/217; 414/221
[58] Field of Search ............... 250/492.2, 442.1, 441.1; 414/217, 221

[56] References Cited

U.S. PATENT DOCUMENTS

| | | | |
|---|---|---|---|
| 3,761,709 | 9/1973 | Hasegawa et al. | 250/441.1 |
| 3,874,525 | 4/1975 | Hassan et al. | 250/442.1 |
| 3,958,124 | 5/1976 | Koch et al. | 250/442.1 |
| 4,227,080 | 10/1980 | Okura et al. | 250/442.1 |
| 4,749,868 | 6/1988 | Hatanaka et al. | 250/442.1 |
| 4,763,005 | 8/1988 | Schumer | 250/398 |

FOREIGN PATENT DOCUMENTS 0095367 11/1983 European Pat. Off. ......... 250/492.2

*Primary Examiner*—Jack I. Berman
*Attorney, Agent, or Firm*—Foley & Lardner, Schwartz, Jeffery, Schwaab, Mack, Blumenthal & Evans

[57] ABSTRACT

A vacuum device comprises a vacuum working chamber for performing a predetermined process to a material such as substrate and a vacuum prechamber for changing the material. Both the vacuum chambers are coupled by a coupling member so as to communicate the interiors of the respective chambers and the communcation is managed by valve means located for the coupling member. Both vacuum chambers may be constructed so as to be movable or pivotable horizontally with respect to each other. The coupling member may be constructed as an independent member which is inserted between both the vacuum chambers as occasion demands.

10 Claims, 2 Drawing Sheets

VACUUM DEVICE FOR HANDLING WORKPIECES

BACKGROUND OF THE INVENTION

This invention relates to a vacuum device particularly adaptable for forming a descriptive pattern on a material by utilizing an energy beam and observing and measuring the material by the use of the energy beam.

A conventionally known vacuum device generally comprises a vacuum working chamber in the shape of a box which effects a predetermined process to a material such as a substrate, and a vacuum prechamber also in the shape of a box which carries out the changing operation of the material in the working chamber while maintaining the vacuum condition. Both vacuum chambers are communicated through a communicating member which is provided with valve means for performing the communication between both the vacuum chambers.

The working chamber is provided with an electronic gun for processing material such as substrate disposed in the vacuum chamber and the electronic gun emits an energy beam such as electronic ray to the material to form the descriptive pattern on the surface of the material.

The thus processed material is then transferred into the vacuum prechamber now in a state of atmospheric pressure, and the prechamber is then closed to carry out the following vacuuming operation. At this time, the vacuum state in the working chamber is maintained by closing the vacuum valve means. When the vacuum state in the prechamber is obtained, the valve means is opened to communicate both chambers through the communicating member to thereby transfer the material in the prechamber into the working chamber to a predetermined position. The valve means is thereafter closed and the energy beam is emitted from the electronic gun to the material in the working chamber to carry out a process such as for forming the descriptive pattern to the material. After the completion of this process, the valve means is opened to return the processed material in the prechamber and the valve means is then closed. The vacuum state in the prechamber is thereafter released and the material is taken out from the prechamber when the interior of the prechamber reaches the atmospheric condition.

In order to attain the series of high speed treatment or process described above, it has been proposed to carry out the simultaneous treatment processes in both the working chamber and the prechamber to significantly reduce the processing time.

However, in the vacuum device particularly for a semiconductor apparatus, it is a most significant problem to shorten the turn-around time to treat materials in, for example, a sheeting procedure therefor. Namely, in the vacuum device of the construction described above, the batch processing is usually carried out, so that when one batch includes ten sheets of the materials and about 30 minutes are required for the treatment of one material, at least 300 minutes are required till the materials of one batch treated have been taken out from the vacuum device, requiring a considerably long time including waste time. Therefore, the sheeting procedure becomes a significant problem for the improvement of the turn-around time.

With conventional vaccum devices, however, there is a problem for the sheeting procedure in that the vacuuming operation, leaking operation, material exchanging operation with respect to the prechamber are carried out considerably frequently, thus requiring much time and labour.

In order to eliminate such a problem, it may be possible to carry out parallel processing in the working chamber and the prechamber. However, for example, when the descriptive pattern formation is carried out in the working chamber and the vacuuming, leaking and exchanging operations are performed in parallel in the prechamber, and various vibrations caused by the operations in the prechamber are transmitted to the working chamber, resulting in the inferior descriptive performance in the working chamber.

SUMMARY OF THE INVENTION

An object of this invention is to substantially improve the defects or drawbacks described above and to provide a vacuum device capable of shortening the turn around time due to the sheeting procedure for a material such as substrate.

Another object of this invention is to provide a vacuum device capable of performing parallel processes simultaneously with high precision and at a high speed.

These and other objects can be achieved according to this invention by providing a vacuum device comprising a vacuum working chamber for performing a predetermined process to a material disposed in the vacuum working chamber means, a vacuum prechamber to be connected to the vacuum working chamber for changing the material in the vacuum working chamber means in vacuum condition, a member provided on the side walls of the vacuum working chamber and the vacuum prechamber in opposing state for coupling the vacuum working chamber means and the vacuum prechamber to communicate interiors thereof in the coupled state, the coupling means having a structure separable from each other, and a valve member of the location adapted to establish or close the communication between the vacuum working chamber and the vacuum prechamber.

In the preferred embodiments, at least one of the vacuum chambers is constructed to be movable or pivotable with respect to the other one thereof in the horizontal direction and connected with each other through a suitable coupling member. Alternately, a suitable coupling member can be inserted between the vacuum chambers to establish the communication therebetween.

According to the construction of the vacuum device of this invention, the vacuum leaking operation, the vacuuming operation, and the material exchanging operation of the vacuum chambers can be performed in the state with both vacuum chambers being separated to eliminate the transferring of the vibration of one of the vacuum chambers to precisely carry out the various processes without being influenced thereby. The interiors of both vacuum chambers can be communicated during the operations of the kind described above by coupling the vacuum chambers both in the vacuum condition.

DESCRIPTION OF THE PREFERRED EMBODIMENT

Figure 7:
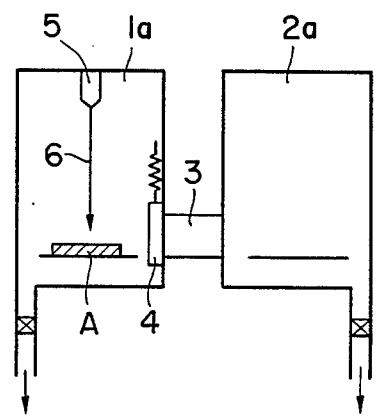
FIG. 7 is a side illustration of the vacuum device of conventional type.

For a better understanding of the present invention, a vacuum device of conventional structure is described briefly herein with reference to FIG. 7, in which a vacuum device generally comprises a vacuum working chamber 1a which effects a predetermined process to a material A such as a substrate and a vacuum prechamber 2a which carries out the changing operation of the material A in the working chamber 1a while maintaining the vacuum condition. Both vacuum chambers 1a and 2a are communicated through a communicating member 3 which is provided with a valve means 4 for performing the communication between both vacuum chambers.

The working chamber 1a is provided with an electronic gun 5 for processing the material A such as substrate disposed in the vacuum chamber 1a and the electronic gun 5 emits an energy beam 6 such as electronic ray to the material to form the descriptive pattern on the surface of the material A.

The vacuum device of the construction described above operates as follows. The material A is set in the vacuum prechamber 2a now in a state of atmospheric pressure and the prechamber is then closed to carry out the following vacuuming operation. At this period, the vacuum condition in the working chamber 1a is maintained by closing the vacuum valve means. When the vacuum condition in the prechamber is obtained, the valve means 4 is opened to communicate both chambers through the communication member 3 to thereby transfer the material in the prechamber 2a into the working chamber to a predetermined position. The valve means 4 is thereafter closed and the energy beam 6 is emitted from the electronic gun 5 to the material in the working chamber 1a to carry out a process such as for forming the descriptive pattern to the material. After the completion of this process, the valve means is opened to return the processed material in the prechamber 2a, and the valve means 4 is then closed. The vacuuming condition in the prechamber is thereafter released and the material A is taken out from the prechamber when the interior of the prechamber reaches the atmospheric condition.

In order to attain a series of high speed treatments or processes described above, it has been proposed to carry out the simultaneous treatment processes in both the working chamber and the prechamber to significantly reduce the processing time.

Moreover, the conventional technique provides a vacuum device having the vacuum working chamber and the vacuum prechamber which are operated simultaneously and in parallel, to improve the working time and make short the processing time or periods. However, these conventional vacuum devices provide various significant problems such as described hereinbefore.

FIGS. 1 to 4 represent the first embodiment of a vacuum device according to this invention, and the vacuum device comprises a working chamber 1 in shape of a box for carrying out a predetermined process to a material A such as substrate and a vacuum prechamber 2 also in shape of a box for exchanging the material from the vacuum chamber 1 in the vacuum condition. The chambers 1 and 2 are constructed so as to be separatable with each other. The vacuum working chamber 1 is mounted on a table 7, and the vacuum prechamber 2 is mounted on a table 8 to be movable in a direction, X-Y in FIG. 2, towards the vacuum working chamber 1 through wheels 9 attached to the lower surface of the prechamber 2 to be rotatable.

The working chamber 1 is provided with an electron gun 5 for effecting the material A such as substrate, disposed in the chamber 1 by the energy beam 6 emitted from the electronic gun 5 for, for example, forming a descriptive pattern on the surface of the material. The measurement and the observation of the material A disposed in the working chamber 1 can also be made by the emission of the energy beam 6 in addition to the formation of the descriptive pattern.

Figure 4:
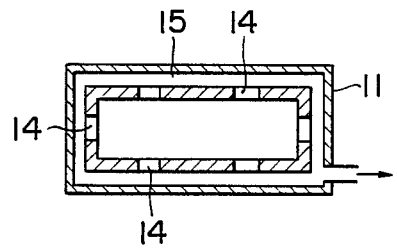
FIG. 4 is a sectional view of the coupling member taken along the line IV—IV shown in FIG. 3.

The vacuum working chamber 1 and the vacuum prechamber 2 are both provided with side surfaces opposing to each other and to the side surfaces are secured cylindrical coupling members 10 and 11 having front surfaces 10a and 11a to be contacted to each other when the cylindrical members are to be connected so as to project from the respective side surfaces. Gate valves 12 and 13 are disposed at the base portions of the coupling members 10 and 11, respectively, to open or close the hollow cylindrical coupling members 10 and 11. The coupling member 11 is of a double wall structure to define an inner space therebetween which is communicated with the interior of the prechamber 2 through a plurality of exhaust holes 14 as shown in FIG. 4, and the inner space is connected to a vacuum pump, not shown. According to this structure, in the condition where both the vacuum chambers 1 and 2 are connected through the coupling members 10 and 11 in direct contact between the coupling surfaces 10a and 11a, the vacuum pump is operated to carry out the vacuuming process.

When it is required to change the material A from the working chamber 1 to the prechamber 2 or vice-versa, the coupling members 10 and 11 are coupled under the state of vacuum of both chambers 1 and 2 and the gate valves 12 and 13 are then opened to establish communication between the working chamber 1 and the prechamber 2 through the coupling members 10 and 11. The material A is then changed when in this state.

Figure 1:
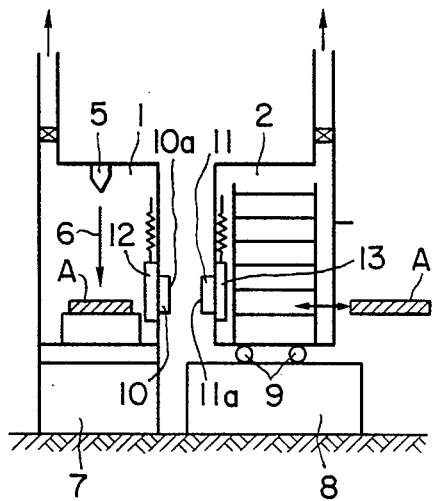
FIG. 1 is a side illustration of the vacuum device according to this invention in a separated state.
Figure 2:
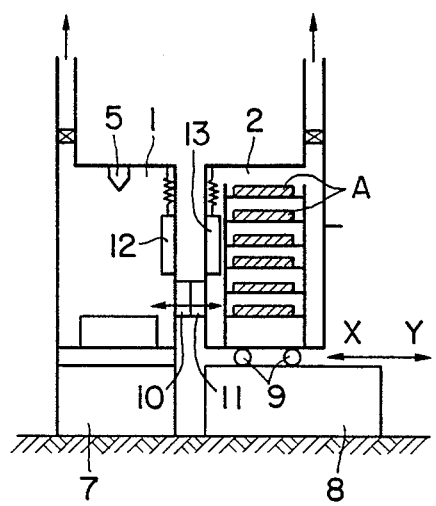
FIG. 2 is a side illustration similar to that of FIG. 1 in a coupled state.
Figure 3:
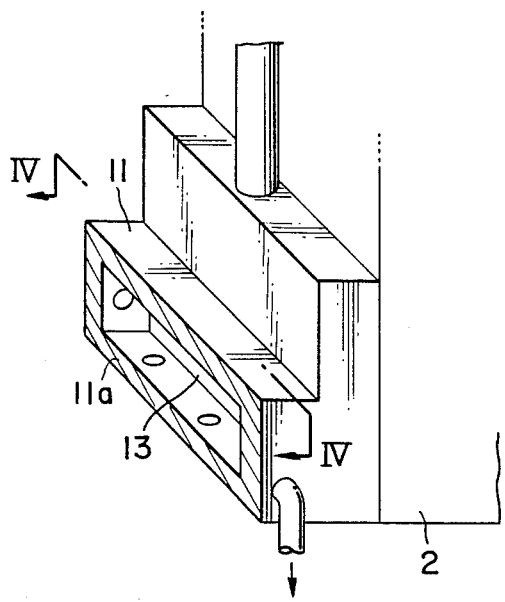
FIG. 3 is a perspective view of coupling member of the vacuum device shown in FIG. 1.

When it is required to carry out the process to the material A in the vacuum working chamber 1, the vacuum prechamber 2 is first moved in a direction apart from the working chamber 1 with the gate valves 12 and 13 closed as shown in FIG. 1 to separate the respective vacuum chambers 1 and 2. Under the state, the electronic gun 5 is operated to irradiate the energy beam 6 to the surface of the material A to thereby carry out the formation of the descriptive pattern thereon. With the vacuum prechamber 2, at the same time, the vacuum leaking operation, material exchanging operation or vacuuming operation will be performed.

According to the separated arrangement of the respective vacuum chambers 1 and 2, the vibration or other movement of the vacuum prechamber 2 during the various operation thereof never be transferred to the vacuum working chamber 1 during the descriptive pattern formation operation, for example, thus finely and precisely forming the pattern on the material A in the working chamber 1 without influenced with the vibration or the like disturbance from the prechamber 2. The creation of the state of vacuum in the interior of the coupling members 10 and 11 is performed by coupling both the vacuum chambers 1 and 2 with the gate valves 12 and 13 closed, opening the gate valve 13 on the side of the vacuum prechamber 2, and vacuuming the interior of the prechamber 2. The vacuuming operation in the interior of the coupling members 10 and 11 may be carried out at the same time of the creation of the vacuum condition of the prechamber 2.

Figure 5:
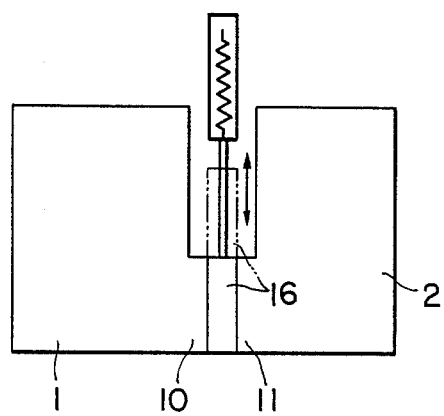
FIG. 5 is an illustration of another embodiment of the vacuum device according to this invention.

FIG. 5 represents the second embodiment according to this invention, in which the vacuum working chamber 1 and the vacuum prechamber 2 are fixedly located with the coupling members 10 and 11 with a space in an opposing state and an intermediate connecting member 16 accommodating gate valves, not shown, therein is inserted into the space between both the coupling members 10 and 11 to be freely interposed therebetween from the vertical direction as viewed. When the intermediate connecting member 16 is lowered to the predetermined position between the coupling members 10 and 11, both the vacuum chambers 1 and 2 are operatively communicated with each other, whereas when the intermediate connecting member 16 is moved upwardly, both the chambers 1 and 2 are separated. In a preferred alternation, the intermediate connecting member 16 may be constructed to be horizontally movable or slidable to carry out the connection or separation of both the vacuum chambers 1 and 2.

Figure 6:
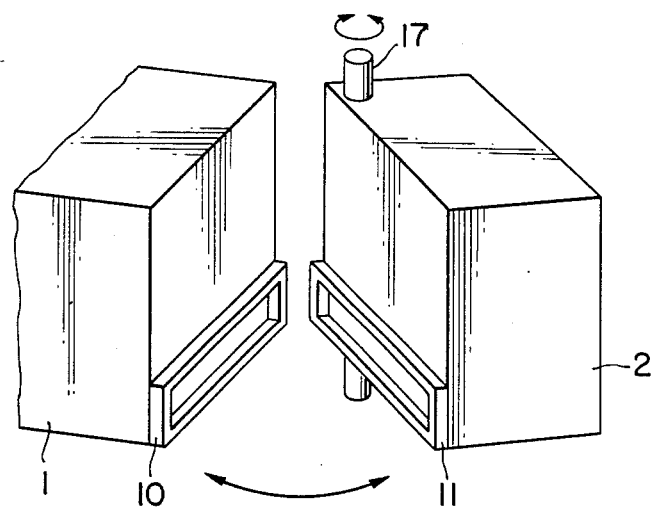
FIG. 6 is an illustration of a further embodiment of the vacuum device according to this invention.

FIG. 6 represents the third embodiment according to this invention, in which the vacuum working member 1 is fixedly located and the vacuum prechamber 2 is secured at one side thereof to the working chamber 1 to be pivotably rotatable through a rotating shaft 17 so that the coupling member 11 of the prechamber 2 moves to contact to or separate from the coupling member 10 of the working chamber 1. According to this construction, the operation of the vacuum working chamber 1 can be performed without influenced with the vibration or the like generated during the operation of the vacuum prechamber 2.

What is claimed is:

1. A vacuum device for handling workpieces comprising:

vacuum working chamber means for performing a predetermined process on a workpiece disposed in said working chamber means;

vacuum prechamber means disposed adjacent to said working chamber means for relative movement to and away from the working chamber means for changing the workpiece in said working chamber means under vacuum condition;

a pair of coupling means provided respectively on side walls of said working chamber means and said prechamber means for opposing sealing connection to couple said working chamber means and said prechamber means for their mutual communication in the state where said prechamber means is moved to said working chamber means;

a first valve means positioned inside the coupling means of the working chamber means to open and close the same; and a second valve means positioned inside the coupling means of the prechamber means to open and close the same.

2. The vacuum device according to claim 1, wherein at least one of said vacuum working chamber means and said vacuum prechamber means is movable in a horizontal direction on a predefined path with respect to the other one thereof for the connection or separation therebetween.

3. The vacuum device according to claim 1, wherein at least one of said vacuum working chamber means and said vacuum prechamber means is pivotable in a horizontal direction with respect to the other one thereof for the connection or separation therebetween.

4. The vacuum device according to claim 1, wherein said vacuum working chamber means and said vacuum prechamber means are fixedly located with said coupling means opposing to each other, and an intermediate connecting means provided with gate valve means is inserted between said coupling means of said vacuum working chamber means and said prechamber means for their mutual communication.

5. The vacuum device according to claim 1, wherein said vacuum working chamber means is equipped with means for emitting an energy beam for processing said material to form a descriptive pattern on a surface of said material.

6. The vacuum device according to claim 5, wherein said means for emitting the energy beam is an electronic gun and said energy beam is an electronic ray.

7. The vacuum device according to claim 1, wherein said vacuum working chamber means is equipped with means for emitting an energy beam for measuring and observing said material.

8. The vacuum device according to claim 7, wherein said means for emitting the energy beam is an electronic gun and said energy beam is an electronic ray.

9. The vacuum device according to claim 2, wherein at least one of said vacuum working chamber mans and said vacuum prechamber means further comprises wheels for moving said chamber means horizontally with respect to each other.

10. The vacuum device according to claim 1, wherein at least one of said pair of coupling means comprises a double wall structure defining an inner space therebetween which is connected with the respective chamber means through a plurality of exhaust holes, and said inner space is connected to a vacuum pump.

* * * * *